US009136592B2

(12) United States Patent
Lee et al.

(10) Patent No.: US 9,136,592 B2
(45) Date of Patent: Sep. 15, 2015

(54) INK FOR PRINTING A MOBILE PHONE ANTENNA PATTERN, METHOD FOR MANUFACTURING A SYNTHETIC RESIN PART FOR A MOBILE PHONE ON WHICH AN ANTENNA PATTERN IS PRINTED USING THE INK, AND SYNTHETIC RESIN PART FOR A MOBILE PHONE ON WHICH AN ANTENNA PATTERN IS PRINTED

(75) Inventors: Kyung-Sook Lee, Incheon-si (KR); Se-Yong Park, Incheon-si (KR); Chul-An Lim, Incheon-si (KR); Byoung-Nam Kim, Gyeonggi-do (KR)

(73) Assignees: Yen An Technology Co., LTD, Incheon-si (KR); Mobitech Corp, Seoul (KR)

( * ) Notice: Subject to any disclaimer, the term of this patent is extended or adjusted under 35 U.S.C. 154(b) by 439 days.

(21) Appl. No.: 13/637,958

(22) PCT Filed: Jul. 5, 2010

(86) PCT No.: PCT/KR2010/004364
§ 371 (c)(1),
(2), (4) Date: Dec. 11, 2012

(87) PCT Pub. No.: WO2011/122737
PCT Pub. Date: Oct. 6, 2011

(65) Prior Publication Data
US 2013/0076572 A1 Mar. 28, 2013

(30) Foreign Application Priority Data
Mar. 30, 2010 (KR) .................. 10-2010-0028626

(51) Int. Cl.
*H01Q 1/38* (2006.01)
*H01P 11/00* (2006.01)
*C09D 5/24* (2006.01)
*C09D 7/12* (2006.01)
(Continued)

(52) U.S. Cl.
CPC .. *H01Q 1/38* (2013.01); *C09D 5/24* (2013.01); *C09D 7/1216* (2013.01); *C09D 11/102* (2013.01); *H01B 1/02* (2013.01); *H01Q 1/243* (2013.01); *H05K 3/1275* (2013.01); *C08K 3/08* (2013.01); *H05K 1/092* (2013.01); *H05K 1/165* (2013.01); *H05K 2203/0534* (2013.01)

(58) Field of Classification Search
CPC ........... H01Q 1/38; H01Q 1/02; H01Q 1/243; H01B 1/02
See application file for complete search history.

(56) References Cited

U.S. PATENT DOCUMENTS 6,165,384 A * 12/2000 Cooper et al. ........... 252/301.19
6,375,866 B1 * 4/2002 Paneccasio et al. ........... 252/511
(Continued)

FOREIGN PATENT DOCUMENTS

EP 2063489 A1 5/2009
JP 2004-241294 A 8/2004
(Continued)

Primary Examiner — Trinh Dinh
(74) Attorney, Agent, or Firm — TechLaw LLP

(57) ABSTRACT

The ink for printing an antenna pattern for a mobile phone according to an embodiment of the present invention includes a mixture of one of silver (Ag) powder, nickel (Ni) powder, copper (Cu) powder, and gold (Au) powder, liquid acrylonitrile, liquid polystyrene, liquid butadiene, and methyl ethyl ketone (MEK) as a diluent. The present invention does not include a plating process, and thus allows a significant improvement in productivity.

23 Claims, 2 Drawing Sheets

(51) Int. Cl.
*C09D 11/102* (2014.01)
*H01Q 1/24* (2006.01)
*H05K 3/12* (2006.01)
*H01B 1/02* (2006.01)
*C08K 3/08* (2006.01)
*H05K 1/09* (2006.01)
*H05K 1/16* (2006.01)

(56) References Cited

U.S. PATENT DOCUMENTS

| | | | |
|---|---|---|---|
| 6,399,903 B1 | 6/2002 | Stevenson | |
| 6,400,323 B2* | 6/2002 | Yasukawa et al. | 343/700 MS |
| 6,680,702 B2* | 1/2004 | Yde-Andersen et al. | 343/700 MS |
| 7,375,698 B2* | 5/2008 | Wolfenden et al. | 343/786 |
| 7,388,549 B2* | 6/2008 | Chiang | 343/713 |
| 8,669,917 B1* | 3/2014 | Wagner | 343/905 |
| 2009/0295657 A1* | 12/2009 | Gakhar et al. | 343/718 |
| 2010/0059596 A1* | 3/2010 | Achhammer | 235/492 |
| 2010/0093119 A1* | 4/2010 | Shimizu | 438/29 |
| 2012/0194392 A1* | 8/2012 | Inoue et al. | 343/700 MS |

FOREIGN PATENT DOCUMENTS

| | | |
|---|---|---|
| JP | 2004-256750 A | 9/2004 |
| JP | 2006-519558 A | 8/2006 |
| KR | 10-2008-0014715 A | 2/2008 |
| KR | 10-2008-0015134 A | 2/2008 |

* cited by examiner

INK FOR PRINTING A MOBILE PHONE ANTENNA PATTERN, METHOD FOR MANUFACTURING A SYNTHETIC RESIN PART FOR A MOBILE PHONE ON WHICH AN ANTENNA PATTERN IS PRINTED USING THE INK, AND SYNTHETIC RESIN PART FOR A MOBILE PHONE ON WHICH AN ANTENNA PATTERN IS PRINTED

TECHNICAL FIELD

The present invention relates to an ink for printing an antenna pattern and a manufacturing method thereof.

BACKGROUND ART

In general, resin materials (plastics) are widely used to provide lighter and smaller designs for various electrical and electronic devices. For example, the structure of an embedded antenna in a mobile phone may include a pattern (loop) for wireless transmissions and receptions formed on a surface of a body molded with a PC (polycarbonate) material, for its exceptional qualities in terms of impact resistance and wear resistance.

In the past, it was common to utilize the method of thermally fusing a metal piece forming a particular pattern onto a resin body. However, this method may result in defects, such as the metal piece becoming partially separated from the resin body due to uneven adhesion across the pattern, and there may also be difficulties in maintaining important properties, such as for wireless communication or electromagnetic shielding, for extended periods of time. Because of these reasons, a preferred method for forming a conductive pattern on a non-conductive body is electroless plating, as it entails relatively less property changes. Electroless plating involves applying a reducing agent to a solution containing metal ions in order to reduce and deposit the metal onto an object, and is differentiated from immersion plating in ionization tendency.

One example is found in Korean Patent Publication No. 10-2005-0122000, which discloses "a method of pre-treatment for non-electrolysis plating of resin containing polycarbonate constituents," and proposes a method of expanding a surface and then performing etching by removing the expanded surface. However, this method entails a somewhat complicated process and does not ensure stable properties.

Also, Korean Registered Patent No. 10-0552529 entitled "method for manufacturing of an antenna" discloses a 'method of manufacturing an antenna for use in a wireless portable terminal that is composed of an internal antenna block manufactured from polycarbonate or a synthetic resin containing polycarbonate and an antenna loop plated on an external surface of the antenna block, where the method enables a small volume for the terminal and provides high durability.' The specific elements of this method include etching and neutralizing the antenna block, applying polarity by pre-dipping, applying pre-treatment by activating a surface of the polarized antenna block, and forming an electroless copper plating layer on the pre-treated surface of the internal antenna block.

Also, Korean Registered Patent No. 10-0387663 entitled "method for plating engineering plastics" discloses a 'method of' improving plating properties for engineering plastics, with which it was previously to apply electroless plating and electroplating, by forming a primer layer by spraying and coating an ABS resin and/or a UV-curable dye over a surface of an engineering plastic, applying electroless plating or dry plating such as vacuum deposition, sputtering, ion plating, etc., coating a primer on the substrate, and then applying electroless plating.'

However, existing methods of forming an antenna pattern, by printing a pattern with ink onto a plastic surface and performing plating over the pattern, entail complicated processes and necessarily include plating processes, so that the reduced yield resulting from the plating process causes lower productivity. Moreover, plating processes are detrimental to the environment in most cases, and hence entail problems of polluting the environment and imposing health risks for workers participating in the processes.

DISCLOSURE

Technical Problem

An aspect of the present invention, devised to resolve the problems above, lies in enabling the manufacture of an antenna pattern for a mobile phone without including a plating process, so as to drastically improve the productivity of manufacturing the mobile phone and reduce pollution to the environment.

Technical Solution

One aspect of the present invention provides an ink for printing an antenna pattern for a mobile phone, the ink comprising a mixture of conductive powder, liquid acrylonitrile, liquid polystyrene, liquid butadiene, and methyl ethyl ketone (MEK) as a diluent.

The conductive powder can include any one of silver (Ag) powder, nickel (Ni) powder, copper (Cu) powder, and gold (Au) powder.

The ink may be formed by mixing the methyl ethyl ketone (MEK) as a diluent into a conductive paste that includes 60 wt % to 70 wt % of any one of the silver (Ag) powder, nickel (Ni) powder, copper (Cu) powder, and gold (Au) powder, 10 wt % to 20 wt % of the liquid acrylonitrile, 10 wt % to 20 wt % of the liquid polystyrene, and 10 wt % to 20 wt % of the liquid butadiene.

The ink containing a mixture of the conductive paste and the methyl ethyl ketone may have a viscosity of 200 mPa·s to 300 mPa·s.

The ink containing a mixture of the conductive paste and the methyl ethyl ketone may be maintained at a temperature of 30° C. to 50° C.

The conductive paste and the methyl ethyl ketone may be mixed by stirring, with a stirring time of 10 hours to 15 hours.

Another aspect of the present invention provides a method of manufacturing a plastic part for a mobile phone having an antenna pattern printed using conductive ink, where the method includes: a pad transfer step of attaching the conductive ink on a print pad in a form of an antenna pattern to be printed; a heating step of heating the print pad that has passed through the pad transfer step; an ionizing step of ionizing a plastic part on which the antenna pattern is to be printed by emitting electrons with high voltage; a pattern printing step of printing an antenna pattern onto a surface of the plastic part for the mobile phone by pressing the print pad that has passed through the ionizing step onto the surface of the plastic part for the mobile phone; and a drying step of heating and drying the plastic part for the mobile phone that has passed through the pattern printing step.

In the heating step, the print pad may be heated by blowing hot air.

In the heating step, the print pad may be heated to 70° C. to 90° C.

In the heating step, the print pad may be heated for 5 seconds to 10 seconds.

In the printing step, the thickness of the antenna pattern may be 1 μm to 10 μm.

In the drying step, the temperature may be 60° C. to 150° C.

In the drying step, the drying step may be 1 hour to 12 hours.

Other aspects of the present invention include a plastic part for a mobile phone having an antenna pattern printed with an ink described above, and a plastic part for a mobile phone having a printed antenna pattern manufactured by a method described above.

Advantageous Effects

The ink for printing an antenna pattern for a mobile phone, the method of manufacturing a plastic part for a mobile phone having an antenna pattern printed using the conductive ink, and the plastic part for a mobile phone having a printed antenna pattern, according to certain aspects of the present invention, provide the effect of enabling manufacture of an antenna pattern for a mobile phone without including a plating process, so that the productivity of manufacturing the mobile phone may be drastically improved and pollution to the environment may be reduced.

MODE FOR INVENTION

An embodiment of the present invention will be described below in more detail with reference to the accompanying drawings.

Figure 1:
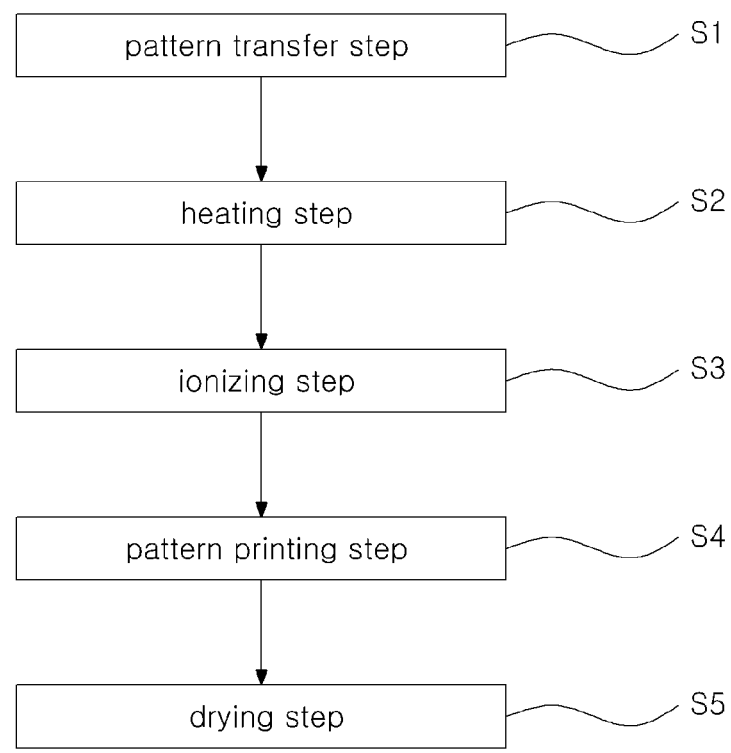
FIG. 1 is a process diagram illustrating a method of manufacturing a part for a mobile phone on which the antenna pattern is printed with ink according to an embodiment of the present invention.
Figure 2:
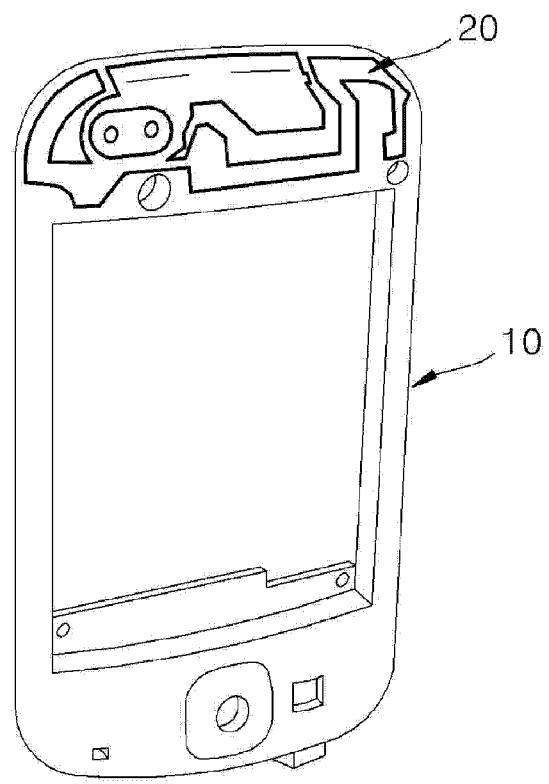
FIG. 2 is a diagram schematically illustrating the part for a mobile phone manufactured by the method of FIG. 1.

FIG. 1 is a process diagram illustrating a method of manufacturing a part for a mobile phone on which the antenna pattern is printed with ink according to an embodiment of the present invention. FIG. 2 is a diagram schematically illustrating the part for a mobile phone manufactured by the method of FIG. 1.

Referring to FIGS. 1 and 2, an ink for printing an antenna pattern for a mobile phone according to a preferred embodiment of the present invention may be formed by mixing any one of silver (Ag) powder, nickel (Ni) powder, copper (Cu) powder, and gold (Au) powder, with liquid acrylonitrile, liquid polystyrene, liquid butadiene, and methyl ethyl ketone (MEK) as a diluent. More specifically, the ink for printing an antenna pattern for a mobile phone may be used to form an antenna pattern on a surface of the mobile phone's housing or cover or frame made of a synthetic resin such as polycarbonate, etc. Unlike existing types of ink, the ink for printing an antenna pattern for a mobile phone may contain conductive metal particles.

That is, the ink for printing an antenna pattern for a mobile phone can be formed by mixing the methyl ethyl ketone (MEK) as a diluent into a conductive paste that includes 60 wt % to 70 wt % of any one of the silver (Ag) powder, nickel (Ni) powder, copper (Cu) powder, and gold (Au) powder, 10 wt % to 20 wt % of the liquid acrylonitrile, 10 wt % to 20 wt % of the liquid polystyrene, and 10 wt % to 20 wt % of the liquid butadiene.

The silver powder, nickel powder, copper powder, and gold powder may provide the antenna pattern with conductivity, which allows the antenna pattern to emit RF signals. That is, the silver powder, nickel powder, copper powder, and gold powder are all of conductive metals having high electrical conductivity. The ink according to an embodiment of the invention can be manufactured with any one selected from the silver powder, nickel powder, copper powder, and gold powder. It may be preferable to include any one of the silver powder, nickel powder, copper powder, and gold powder in a content of 60 wt % to 70 wt %. If the content of the conductive powder is less than 60 wt %, the electrical properties of the printed antenna pattern may be degraded, and consequently, the properties of the antenna may be inadequate. This is because the contents of the thermosetting resins such as acrylonitrile, polystyrene, and butadiene would be relatively increased, and hence the resistance would be higher. Also, if the content of the metal powder is greater than 70 wt %, the ink may not easily attach to the plastic part. This is because the contents of the thermosetting resins would be relatively decreased, and hence the adhesion would be lower.

The ink for printing an antenna pattern for a mobile phone may include 10 wt % to 20 wt % of liquid acrylonitrile, 10 wt % to 20 wt % of liquid polystyrene, and 10 wt % to 20 wt % of liquid butadiene. The liquid acrylonitrile, liquid polystyrene, and liquid butadiene are components that increase the adhesion to the plastic part. If the content of acrylonitrile is less than 10 wt %, the ink for printing an antenna pattern for a mobile phone would have low adhesion to the plastic part, and this may result in the problem of low durability of the mobile phone. Also, if the content of the acrylonitrile is greater than 20 wt %, the ink for printing an antenna pattern for a mobile phone would have low adhesion to the plastic part, and this may result in the problem of low durability of the mobile phone. The same applies to both polystyrene and butadiene, and therefore, it may be preferable to mix in each of the liquid acrylonitrile, liquid polystyrene, and liquid butadiene within a range of 10 wt % to 20 wt %.

By mixing the conductive powder, such as silver powder, nickel powder, copper powder, and gold powder, with the liquid acrylonitrile, liquid polystyrene, and liquid butadiene, each mixed in within a range of 10 wt % to 20 wt %, a conductive paste can be formed. As the conductive paste may have high viscosity, it may be necessary to increase its fluidity, in order to be able to form an antenna pattern on the plastic part. To this end, methyl ethyl ketone (MEK), typically used as a diluent, may be mixed in. By mixing the methyl ethyl ketone with the conductive paste, the ink can be produced with a viscosity suitable for printing the antenna pattern on the plastic part. The viscosity of the ink containing the mixture of conductive paste and methyl ethyl ketone may preferably be 200 mPa·s to 300 mPa·s. If the viscosity of the ink is less than 200 mPa·s, the antenna pattern may be printed with an excessively low thickness. If the viscosity of the ink is greater than 300 mPa·s, the antenna pattern may be printed with an excessively high thickness. The "mPa·s" used as a unit of viscosity is pronounced "millipascal-second," and 1 mPa·s is equal to 1 cP (centipoise).

The temperature of the ink containing the mixture of conductive paste and methyl ethyl ketone may preferably be kept at 30° C. to 50° C. If the temperature of the ink is lower than 30° C., it may be difficult to perform the stirring when mixing the conductive paste with the methyl ethyl ketone. Also, if the temperature of the ink is higher than 50° C., the methyl ethyl ketone may vaporize during the mixing of the conductive paste with the methyl ethyl ketone, making it difficult to obtain a desired viscosity.

The means for mixing the conductive paste with the methyl ethyl ketone may include stirring, where the stirring time may preferably last for 10 hours to 15 hours. If the stirring time is less than 10 hours, the viscosity of the mixed ink may be uneven. If the stirring time is greater than 15 hours, the efficiency of the stirring may be reduced, since the viscosity of the mixed ink would be settled to a particular viscosity.

A detailed description will now be provided of a method of manufacturing a plastic part for a mobile phone having an antenna pattern printed using an ink such as that described above (hereinafter referred to as the "manufacturing method").

The manufacturing method may include a pad transfer step (S1), a heating step (S2), an ionizing step (S3), a pattern printing step (S4), and a drying step (S5).

In the pad transfer step (S1), the ink may be attached onto a print pad in the form of the antenna pattern to be printed. The print pad may be made of rubber or synthetic resin having a high elastic recovery property. The antenna pattern may be transferred onto the print pad by pressing the print pad onto the ink held on a cast having the form of the antenna pattern, in the same manner as ink is applied on an ink stamp.

In the heating step (S2), the print pad that has passed through the pad transfer step (S1) may be heated, by blowing hot air onto the print pad. The heating step (S2) is a very important process, as it allows the ink pattern transferred onto the print pad to attach well to the surface of the plastic part 10 for the mobile phone in the pattern printing step (S4) described below. In the heating step (S2), the print pad may be heated by blowing hot air. Heating the print pad may form a condition that allows the antenna pattern attached on the print pad to separate well. In the heating step (S2), the print pad may preferably be heated to a temperature of 70° C. to 90° C. If the print pad is heated to lower than 70° C., the thickness of the antenna pattern 20 may be low, when the antenna pattern attached to the print pad is printed onto the plastic part 10 in the pattern printing step (S4) described below. That is, the antenna pattern attached to the print pad may not separate well from the print pad. Conversely, if the print pad is heated to over 90° C., the print pad itself may undergo thermal deformation.

In the heating step (S2), the print pad may preferably be heated for 5 seconds to 10 seconds. The duration of the heating in the heating step is related to the conditions for allowing antenna pattern attached to the print pad to separate well from the print pad. That is, if the heating time in the heating step is less than 5 seconds, the thickness of the antenna pattern may be low, when the antenna pattern attached to the print pad is printed onto the plastic part 10 in the pattern printing step (S4) described below. That is, the antenna pattern attached to the print pad may not separate well from the print pad. Conversely, if the heating time in the heating step is more than 10 seconds, the print pad may be overheated and may undergo thermal deformation.

After the heating step, an ionizing step (S3) may be performed, to remove impurities incorporated during the transfer of ink onto the product, suppress the spreading phenomenon that may occur during printing, and enable more efficient attaching. The ionizing may be performed on the plastic part 10, to which the printing will be implemented.

According to a preferred embodiment of the invention, the ionizing can involve ionizing molecules by generating a strong magnetic field. For example, a high voltage (5-20 kV) of AC or DC may be applied to a sharp tip of a pin to ionize electrons.

During the ionizing, if the voltage is positive at the tip of the pin, then positive ions would be generated, and if it is negative, then negative ions would be generated.

In the pattern printing step (S4), the print pad that has passed through the ionizing step (S3) may be pressed onto a surface of the plastic part 10 for a mobile phone, in the same manner as printing with an ink stamp, to print the antenna pattern 20 onto the surface of the plastic part 10 for a mobile phone. The thickness of the antenna pattern 20 printed in the pattern printing step (S4) may preferably be 1 μm to 10 μm. If the thickness of the antenna pattern 20 is lower than 1 the adhesion of the antenna pattern 20 may be weak, and the properties of the antenna may be degraded. Also, if the thickness of the antenna pattern 20 is greater than 10 μm the adhesion of the antenna pattern 20 may be weak, and the properties of the antenna may be degraded. In cases where the antenna pattern 20 that is to be printed on the plastic part 10 for the mobile phone has a 3-dimensional structure, the pattern transfer step (S1), the heating step (S2), and the pattern printing step (S4) can be performed sequentially a multiple number of times.

In the drying step (S5), the plastic part 10 for the mobile phone that has passed through the pattern printing step (S4) may be heated and dried. In the drying step (S5), the temperature may preferably be set to 60° C. to 150° C. If the temperature during the drying step (S5) is lower than 60° C., the adhesion of the antenna pattern 20 printed on the plastic part 10 may be weak. If the temperature during the drying step (S5) is higher than 150° C., the plastic part 10 may undergo thermal deformation. In the drying step (S5), the drying time may preferably be 1 hour to 12 hours. If the drying time is less than 1 hour, the adhesion of the antenna pattern may be weak, and the electrical resistance value may be increased. If the drying time is more than 12 hours, there would be unnecessary drying after the antenna pattern 20 is sufficiently dried, and thus it would not be cost effective.

With a plastic part for a mobile phone in which the antenna pattern is printed with the ink described above or the a plastic part for a mobile phone that is manufactured by the method described above, the process of forming a metal plating layer over the ink layer may be omitted, as compared to conventional parts. Thus, the problem of reduced production yield during the forming of a plating layer may be resolved, thereby allowing a significant improvement in productivity. Also, since there is no plating process included, the toxic environment associated with the plating process may be avoided, whereby the problems of polluting the environment and posing health risks for workers may be resolved.

Furthermore, looking at the aspect of time, since it is not necessary to allocate time for a plating process, the time for manufacturing the product may be significantly reduced. Therefore, the number of mobile phone parts produced per unit time would be significantly increased. Ultimately, the productivity can be radically improved compared to the cases of producing the plastic parts for mobile phones using an existing type of ink or using an existing method, while the quality of the products can be kept comparable to the level of existing products.

An adhesion test generally used in the industry for testing used for the antenna patterns is a cross-cut pattern test. The purpose of an adhesion test is to check the attachment strength between a base material and a material applied as surface treatment on a device part, so as to avoid problems such as peeling, stripping, etc., under consumer use conditions. One method of adhesion testing involves making cuts with a blade in eleven positions, both laterally and longitudinally, in intervals of 1 mm each, in the surface of the part subject to the adhesion test. This results in a hundred 1 mm×1 mm grids. Burrs or foreign substances are removed from the grids thus created. Then, a tape is attached over the grids such that there are no bubbles formed. The attached tape is quickly pulled off at an angle of 90° to the grid surface. This process is repeated 4 or 5 times. If, as a result, each grid (1 mm×1 mm) is detached 20% or less, then the sample is considered to pass the test. Adhesion tests performed on antenna patterns formed according to embodiments of the invention disclosed herein by printing the antenna pattern with a printing ink on a synthetic resin base and then plating a metal over the printed pattern to complete the antenna pattern were seen to have better adhesion than an antenna pattern formed using a conventional method. Thus, the antenna pattern of a plastic part for a mobile phone printed with an antenna pattern manufactured by a method according to an embodiment of the present invention can provide better adhesion compared to existing methods.

Moreover, the products made according to an embodiment of the present invention also showed the same results as existing products in terms of electrical resistance properties. To provide comparable properties in the product while radically improving productivity is an extraordinary achievement of the present invention. The improvement in productivity also entails the effect of reduced costs of manufacturing.

While the present invention has been described above with reference to a preferred embodiment, the invention is not limited to the embodiment. It is to be appreciated that various embodiments can be implemented without departing from the spirit and scope of the present invention.

The invention claimed is:

1. An ink for printing an antenna pattern for a mobile phone, the ink comprising a mixture of conductive powder, liquid acrylonitrile, liquid polystyrene, liquid butadiene, and methyl ethyl ketone (MEK) as a diluent.

2. The ink for printing an antenna pattern for a mobile phone according to claim 1, wherein the conductive powder comprises any one of silver (Ag) powder, nickel (Ni) powder, copper (Cu) powder, and gold (Au) powder.

3. A plastic part for a mobile phone having an antenna pattern printed thereon, wherein the ink according to claim 2 is printed as the antenna pattern.

4. The ink for printing an antenna pattern for a mobile phone according to claim 1, wherein the ink is formed by mixing the methyl ethyl ketone (MEK) as a diluent into a conductive paste comprising 60 wt % to 70 wt % of the conductive powder, 10 wt % to 20 wt % of the liquid acrylonitrile, 10 wt % to 20 wt % of the liquid polystyrene, and 10 wt % to 20 wt % of the liquid butadiene.

5. The ink for printing an antenna pattern for a mobile phone according to claim 4, wherein the ink containing a mixture of the conductive paste and the methyl ethyl ketone has a viscosity of 200 mPa·s to 300 mPa·s.

6. The ink for printing an antenna pattern for a mobile phone according to claim 4, wherein the ink containing a mixture of the conductive paste and the methyl ethyl ketone is maintained at a temperature of 30° C. to 50° C.

7. The ink for printing an antenna pattern for a mobile phone according to claim 4, wherein the conductive paste and the methyl ethyl ketone are mixed by stirring with a stirring time of 10 hours to 15 hours.

8. A plastic part for a mobile phone having an antenna pattern printed thereon, wherein the ink according to claim 7 is printed as the antenna pattern.

9. A plastic part for a mobile phone having an antenna pattern printed thereon, wherein the ink according to claim 1 is printed as the antenna pattern.

10. A method of manufacturing a plastic part for a mobile phone having an antenna pattern printed using conductive ink, the method comprising:
  a pad transfer step of attaching the conductive ink on a print pad in a form of an antenna pattern to be printed;
  a heating step of heating the print pad having passed through the pad transfer step;
  an ionizing step of ionizing a plastic part on which the antenna pattern is to be printed by emitting electrons with high voltage;
  a pattern printing step of printing an antenna pattern onto a surface of the plastic part for the mobile phone by pressing the print pad having passed through the ionizing step onto the surface of the plastic part for the mobile phone; and
  a drying step of heating and drying the plastic part for the mobile phone having passed through the pattern printing step.

11. The method of claim 10, wherein the heating step comprises heating the print pad by blowing hot air.

12. The method of claim 10, wherein the heating step comprises heating the print pad to 70° C. to 90° C.

13. The method of claim 10, wherein the heating step comprises heating the print pad for 5 seconds to 10 seconds.

14. The method of claim 10, wherein the antenna pattern printed in the printing step has a thickness of 1 μm to 10 μm.

15. The method of claim 10, wherein a temperature in the drying step is 60° C. to 150° C.

16. The method of claim 10, wherein a drying time in the drying step is 1 hour to 12 hours.

17. The method of claim 10, wherein the conductive ink comprises a mixture of conductive powder, liquid acrylonitrile, liquid polystyrene, liquid butadiene, and methyl ethyl ketone (MEK) as a diluent.

18. The method of claim 10, wherein the ionizing step comprises ionizing the plastic part by applying a high voltage on a tip of a pin.

19. The method of claim 10, wherein the conductive ink comprises a mixture of conductive powder, liquid acrylonitrile, liquid polystyrene, liquid butadiene, and methyl ethyl ketone (MEK) as a diluent and wherein the conductive powder comprises any one of silver (Ag) powder, nickel (Ni) powder, copper (Cu) powder, and gold (Au) powder.

20. The method of claim 10, wherein the conductive ink comprises a mixture of conductive powder, liquid acrylonitrile, liquid polystyrene, liquid butadiene, and methyl ethyl ketone (MEK) as a diluent wherein the ink is formed by mixing the methyl ethyl ketone (MEK) as a diluent into a conductive paste comprising 60 wt % to 70 wt % of the conductive powder, 10 wt % to 20 wt % of the liquid acrylonitrile, 10 wt % to 20 wt % of the liquid polystyrene, and 10 wt % to 20 wt % of the liquid butadiene.

21. The method of claim 10, wherein the conductive ink comprises a mixture of conductive powder, liquid acrylonitrile, liquid polystyrene, liquid butadiene, and methyl ethyl ketone (MEK) as a diluent wherein the ink is formed by mixing the methyl ethyl ketone (MEK) as a diluent into a conductive paste comprising 60 wt % to 70 wt % of the conductive powder, 10 wt % to 20 wt % of the liquid acrylonitrile, 10 wt % to 20 wt % of the liquid polystyrene, and 10 wt % to 20 wt % of the liquid butadiene and wherein the ink containing a mixture of the conductive paste and the methyl ethyl ketone has a viscosity of 200 mPa·s to 300 mPa·s.

22. The method of claim 10, wherein the conductive ink comprises a mixture of conductive powder, liquid acrylonitrile, liquid polystyrene, liquid butadiene, and methyl ethyl ketone (MEK) as a diluent wherein the ink is formed by mixing the methyl ethyl ketone (MEK) as a diluent into a conductive paste comprising 60 wt % to 70 wt % of the conductive powder, 10 wt % to 20 wt % of the liquid acrylonitrile, 10 wt % to 20 wt % of the liquid polystyrene, and 10 wt % to 20 wt % of the liquid butadiene wherein the ink containing a mixture of the conductive paste and the methyl ethyl ketone is maintained at a temperature of 30° C. to 50° C.

23. The method of claim 10, wherein the conductive ink comprises a mixture of conductive powder, liquid acrylonitrile, liquid polystyrene, liquid butadiene, and methyl ethyl ketone (MEK) as a diluent wherein the ink is formed by mixing the methyl ethyl ketone (MEK) as a diluent into a conductive paste comprising 60 wt % to 70 wt % of the conductive powder, 10 wt % to 20 wt % of the liquid acrylonitrile, 10 wt % to 20 wt % of the liquid polystyrene, and 10 wt % to 20 wt % of the liquid butadiene and wherein the conductive paste and the methyl ethyl ketone are mixed by stirring with a stirring time of 10 hours to 15 hours.

* * * * *